(12) United States Patent
Lujan et al.

(10) Patent No.: US 8,465,795 B2
(45) Date of Patent: Jun. 18, 2013

(54) ANNEALING A BUFFER LAYER FOR FABRICATING ELECTRONIC DEVICES ON COMPLIANT SUBSTRATES

(75) Inventors: Rene Lujan, Sunnyvale, CA (US); William S. Wong, San Carlos, CA (US); Julia Rosolovsky Greer, Pasadena, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 403 days.

(21) Appl. No.: 12/123,732

(22) Filed: May 20, 2008

(65) Prior Publication Data

US 2009/0289333 A1 Nov. 26, 2009

(51) Int. Cl.
*B05D 5/12* (2006.01)
*B05D 3/02* (2006.01)

(52) U.S. Cl.
USPC .................. 427/97.1; 427/374.1

(58) Field of Classification Search
USPC .............. 427/97.1, 374.1
See application file for complete search history.

(56) References Cited

U.S. PATENT DOCUMENTS

| | | | |
|---|---|---|---|
| 6,297,158 B1 * | 10/2001 | Liu et al. | 438/687 |
| 2006/0207649 A1 * | 9/2006 | Nabeta | 136/258 |
| 2006/0240605 A1 * | 10/2006 | Moon et al. | 438/149 |
| 2007/0108472 A1 * | 5/2007 | Jeong et al. | 257/192 |
| 2007/0172591 A1 * | 7/2007 | Seo et al. | 427/248.1 |

OTHER PUBLICATIONS

Yong Xiang, Teng Li, Zhigang Suo, and Joost J. Vlassak, High ductility of a metal film adherent on a polymer substrate, Appl. Phys. Lett. 87 (2005).

H. Gleskova and S. Wagner, Electrical response of amorphous silicon thin-film transistors under mechanical strain. Department of Electrical Engineering J. Appl. Physics, 92, 10 (2002).

Helena Gleskova,a I-Chun Cheng, and Sigurd Wagner, "Thermomechanical criteria for overlay alignment in flexible thin-film electronic circuits", Appl. Phys. Lett 88 (2006).

Sarma, Kalluri, "a-Si TFT OLED Fabricated on Low-Temperature Flexible Plastic Substrate", Mat. Res. Soc. Symp. Proc. vol. 814, p. I13.1.1 (2004).

Ke Long, I-Chun Cheng, Alexis Kattamis, Helena Gleskova, Sigurd Wagner, James C. Sturm, "Amorphous-silicon thin-film transistors made at 280° C. on clear-plastic substrates by interfacial stress engineering" Journal of the SID Mar. 15, 2007.

I-Chun Cheng, Alexis Kattamis, Ke Long, James C. Sturm, Sigurd Wagner, "Stress control for overlay registration in a-Si:H TFTs on flexible organic-polymer-foil substrates" Journal of the SID Jul. 13, 2005.

* cited by examiner

*Primary Examiner* — Brian K Talbot
(74) *Attorney, Agent, or Firm* — Jonathan A. Small (57) ABSTRACT

A method of forming a thin-film layered electronic device over a flexible substrate comprises the steps of depositing a buffer layer over the flexible substrate, heating the substrate and buffer layer stack to a temperature at which plastic deformation of the buffer layer takes place, cooling the stack, then forming the thin-film electronic device over the plastically deformed buffer layer without further plastic deformation of the buffer layer. The heating and cooling to cause plastic deformation of the buffer layer is referred to as annealing. The thin-film electronic device is formed by a process according to which all steps are performed at a temperature below that at which further plastic deformation of the buffer layer occurs. In-process strain and runout are reduced, improving device yield on flexible substrates. An optional metal base layer may be formed over the buffer layer prior annealing.

10 Claims, 7 Drawing Sheets

ANNEALING A BUFFER LAYER FOR FABRICATING ELECTRONIC DEVICES ON COMPLIANT SUBSTRATES

STATEMENT REGARDING FEDERALLY SPONSORED RESEARCH AND DEVELOPMENT

The U.S. Government has a fully paid-up license in this invention and the right in limited circumstances to require the patent owner to license others on reasonable terms as provided for by the terms of contract number 70NANB3H3029 awarded by the United States Department of Commerce, National Institute for Standards and Technology.

BACKGROUND

The embodiments described herein relate to thin-film device manufacturing, and more specifically to a method and resulting structure for providing thin-film devices on flexible substrates.

Modern semiconductor manufacturing techniques typically operate on a layer-by-layer basis, depositing and patterning one layer then the next layer above, and so on. The layers may be deposited, patterned, etched, etc. in order to produced an operational electronic structure such as an integrated circuit, sensor or display device, light emitter (light emitting diode—LED, solid state laser, etc.) and the like. Due to their composition of numerous thin layers, devices of this type which include at least one deposited layer are often referred to as thin-film structures, and the associated processes for producing them are often referred to as thin-film processes.

A typical layer of a thin-film structure is deposited and/or processed at a temperature in excess of so-called room temperature. Upon cooling of this layer following formation/processing intrinsic stresses often develop in the layer. One reason that it is common to form thin-film devices on a rigid substrate, such as glass, is the dimensional stability the rigid substrate offers to counter the intrinsic stress. The rigid substrate prevents the deposited film from curling and possibly cracking due to its intrinsic stress.

However, there has been a recent desire in the art for devices formed on flexible substrates such as plastic. Applications of such devices include conformal sensors, flexible (paperlike) displays, portable electronic devices, and so forth. The advantages of a flexible substrate over a rigid substrate are typically lighter weight, increased durability, and of course flexibility. However, manufacturing and processing thin-film devices on flexible substrates requires that careful attention be paid to the intrinsic stresses developed in the thin-film layers. As compared to rigid substrates, flexible substrates typically offer a lesser degree dimensional stability as a platform on which stressed layers may be formed. For example, the intrinsic stresses of thin-films formed on a flexible substrate can result in undesirable curling of the substrate and/or cracking or delamination of the thin-film layer(s).

For certain structures, such as the plastic often used for flexible substrates in thin-film device manufacturing (e.g., Teonex Q65A, a polyethylene napthalate film available from DuPont Teijin, www.dupontteijinfilms.com), heating relaxes internal stresses in the structure. This causes the structure to change dimension, for example expanding in length and/or width. This heat-induced movement is referred to as thermal expansion, and the coefficient of thermal expansion is defined as the degree of expansion divided by the change in temperature. When the structure cools, the stress rises in the structure, for example causing a shrinking in the structure's physical dimensions. In those temperature ranges in which the heating/cooling cycle results in instantaneous reversible dimensional change, i.e., where the structure returns to its original dimension upon cooling, the change in dimension is referred to as elastic deformation. If a critical temperature is exceeded, which depends on the material forming the structure, the cooled structure does not return to its original dimensions, but rather most often has increased final dimensions. This non-reversible deformation is referred to as plastic deformation. For many flexible substrate/thin-film processing systems, the processing temperatures exceed the elastic deformation temperature limit, resulting is a plastically deformed substrate as the processed structure cools. This makes alignment of the various layers very difficult, as the substrate on which the layers are formed changes dimensions from start of processing to end of processing.

More specifically, the layers and the substrate typically present different coefficients of thermal expansion. Thus, when heated, the layers and the substrate expand to differing degrees, or said another way, when the layers and the substrate cool, they change size by different degrees based on their different coefficients of the thermal expansion. This relative difference in degree of change when cooling often leads to a layer-to-layer mis-registration upon completion of the fabrication process, making multi-level photolithography difficult to impossible. Designing measures into the process to compensate for the different degrees of thermal expansion/contraction between substrate and deposited layers has proven to be a significantly difficult problem.

Thin-film thermo-mechanical analysis shows that the most direct method for minimizing layer-to-layer distortion during device fabrication is by adjusting the intrinsic, or built-in, stress in each deposited layer. This technique requires having precise control of the film deposition parameters and tailoring of the built-in stress for dimensional stability, which can result in narrowing of the design parameter range for fabrication of devices such as thin-film transistors (TFT). For example, alternating compensating layers that offset a compressive film with a tensile overlayer and vice-versa results in overall stress reduction in the device heterostructure. Lowering the initial stress-induced curvature, for example by fabricating at lower temperatures, reduces the need for subsequent deposition of strained multi-layers that are difficult to pattern. However, the lower temperatures limit the types of materials and process that can be used in device fabrication. Graded buffer layers have also been used for relieving built-in stress induced by thermal-coefficient mismatch between a substrate and the thin film. This technique is useful for single crystal material systems to control strain relaxation of multilayer heterostructures. However, incorporation of this technique on elemental amorphous materials increases the complexity and cost of device manufacturing.

There is therefore a need in the art for a method and structure for providing improved compensation for thermally-induced expansion and contraction during thin-film device fabrication processes. More specifically, there is a need in the art for a method and structure for minimizing the relative changes in physical dimensions of a flexible substrate and typical thin-film layers formed thereover during the formation process such that during fabrication and upon completion of the fabrication process the various layers of a thin-film device are aligned as required for an operable device, without undue curling of the substrate, cracking of the deposited films, etc.

SUMMARY

Accordingly, a method and structure are disclosed for providing compensation for the mismatch between the thermal expansion coefficients of the substrate and various layers of a thin-film device formed on a flexible substrate. The method and structure minimize the relative changes in physical dimensions of a flexible substrate and typical thin-film layers formed thereover during the formation process such that during fabrication and upon completion of the fabrication process the various layers of a thin-film device are aligned as required for an operable device, without undue curling of the substrate, cracking of the deposited films, etc. One element of this disclosure is the plastic pre-deformation of the flexible substrate.

More specifically, according to one element of the disclosure, a buffer layer is formed on a flexible substrate. The flexible substrate and buffer layer are heated to a point beyond the elastic deformation limit of the buffer layer, a process which we refer to herein as thermal annealing. The flexible substrate and buffer layer are cooled, developing internal stress and consequently returning to new dimensions, which we can refer to as their annealed dimensions. However, the intrinsic stress of the annealed structure is lower than the intrinsic stress of the non-annealed structure. Importantly, if the substrate/buffer layer structure is heated again, but below the point at which further plastic deformation takes place, then the structure deforms, but to a lesser degree than a non-annealed structure due to the lower intrinsic stress of the annealed structure. And, since heating was below the point at which further plastic deformation takes place, as the structure cools, it will return to its annealed dimensions.

Either or both substrate and buffer can be strained plastically. Ideally, the plastically strained component is the stiffer of the two materials. In the case of a silicon dioxide ($SiO_2$)/silicon nitride ($Si_3N_4$) buffer layer on a polyethylene naphthalate (PEN) substrate, the buffer layer is the more rigid material and the thermal expansion coefficient mismatch between the PEN and the buffer is used to plastically strain the buffer. The PEN is a softer material and will have more "give" when strained and remains relatively elastic. However, choices of different materials for either or both of the buffer layer and substrate may lead to a more rigid substrate or nearly equal rigidity between the substrate and buffer layer. Such choices are within the scope of and do not change the nature of the present disclosure.

Therefore, according to one embodiment, following thermal annealing of a flexible substrate and buffer layer stack, subsequent thin-film processing takes place at temperatures below that at which the flexible substrate and buffer layer undergo further plastic deformation. This further processing results in elastic (reversible) deformation (strain) of a relatively smaller amount as compared to a non-annealed substrate and buffer layer stack, which significantly reduces alignment errors ("runout") in the device fabrication process.

According to another aspect of this disclosure, a buffer layer of, for example, silicon dioxide/silicon nitride, is used as a "foundation" to mechanically stabilize the overlay between subsequent layers deposited onto the substrate. The plastic deformation of this buffer layer is accomplished by thermally annealing the deposited buffer layer on the flexible substrate prior to subsequent processing. The annealing conditions are chosen such that the induced mismatch strain will not dramatically change the radius of curvature of the flexible substrate. Subsequent annealing during device processing of the substrate and buffer layer at a temperature below the point at which any further plastic deformation takes place will again result in only small elastic strain.

The above is a summary of a number of the unique aspects, features, and advantages of the present invention. However, this summary is not exhaustive. Thus, these and other aspects, features, and advantages of the present invention will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

The embodiments described herein allow for the fabrication of thin-film transistors (TFT) and similar devices using multi-layer film stacks that have high-built-in stress. Specifically, the incorporation of a plastically strained buffer layer is used as a rigid foundation for subsequent layer deposition. In order for the buffer layer to be effective, thermal annealing is employed to plastically deform the buffer layer prior to the first patterning process step. The substrate may or may not be plastically deformed. In one embodiment, the substrate is not plastically deformed, and remains in an elastically strained condition. If a relatively soft material is used for the substrate, it will move and stay in a position dictated by the plastically strained buffer. However, in other embodiments, the substrate may also be plastically strained if the materials parameters are fixed in a way to allow it to happen. Once plastic deformation occurs, the lateral dimensions are mechanically "locked" and subsequent processing steps will result in reversible elastic deformation only, bringing the lateral dimensions to their annealed positions.

Figure 1:
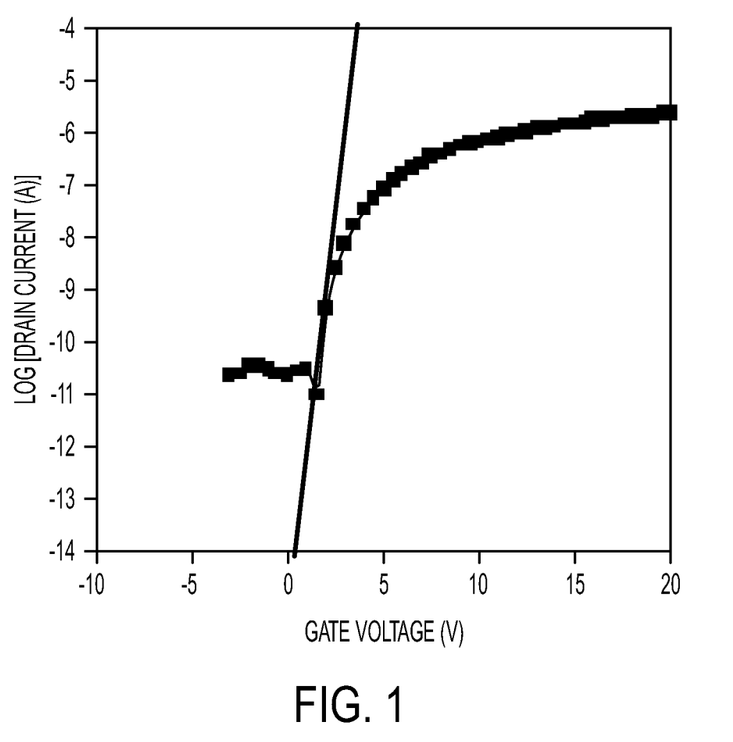
FIG. 1 is a graph of the current-voltage (I-V) characteristics of a TFT fabricated using conventional plasma-enhanced chemical vapor deposition (PECVD) a-Si:H and dielectric layers on a strained buffer layer and plastic substrate.

One exemplary process for creating the strained buffer layer comprises the following steps:
- starting material—flexible substrate, e.g. polyethylene naphthalate (PEN)
- deposition of buffer layer (without breaking vacuum) onto flexible substrate, e.g., 200-400 nanometers (nm), preferably 300 nm, of silicon dioxide ($SiO_2$) on 200-400 nm, preferably 300 nm, of silicon nitride ($Si_3N_4$)
- deposition of the first metal layer (base metal layer) for patterning onto the buffer, e.g., 100-150 nm of tantalum (Ta), preferable 120 nm
- blanket anneal of heterostructure stack on flexible substrate/buffer layer (flex) platform, e.g., 180° C. vacuum anneal of Ta/$SiO_2$/$Si_3N_4$/PEN stack for 30 minutes
- pattern first layer at room temperature, e.g., pattern gate layer (level 1) on Ta film, followed by metal etch and resist strip deposition and processing of subsequent thin films below blanket annealing temperature This embodiment has proved effective for a variety of amorphous silicon (a-Si:H)-based TFT structures having different overlying film stresses. Device performance of the TFTs on the strained buffer layer did not show measurable differences as compared to devices formed on a traditional substrate without the annealing step. High performance current-voltage characteristics have been measured. With reference to FIG. 1, there is shown therein a graph of the current-voltage (I-V) characteristics of a TFT fabricated using conventional plasma-enhanced chemical vapor deposition (PECVD) a-Si:H and dielectric layers on a strained buffer layer and plastic substrate. The I-V curve shows device characteristics that are comparable to high-performance TFTs on glass. The field-effect mobility is ~0.9 cm$^2$/Vs, threshold voltage is <5 V, and the sub-threshold slope is ~0.5 V/decade. The geometry of the device is W/L ~2.5 and the source/drain voltage is 5 V.

Figure 2:
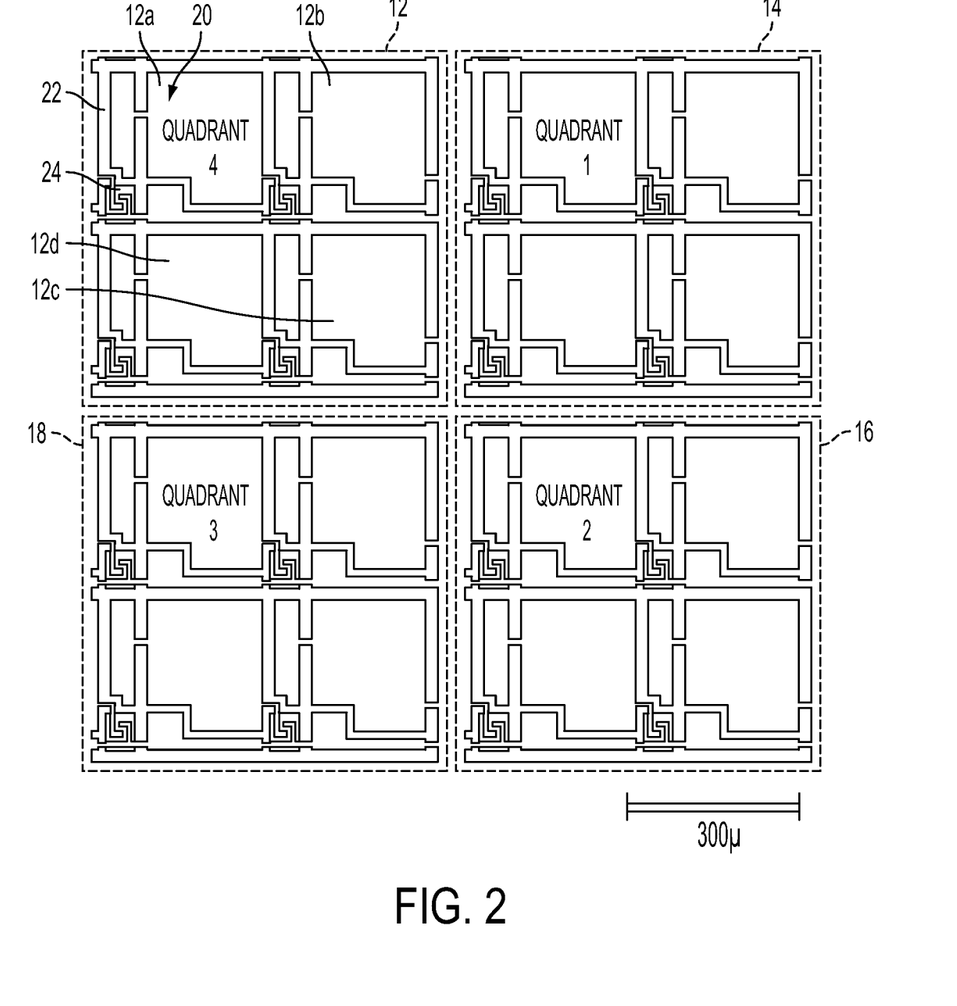
FIG. 2 is a plan view of a portion of a TFT array showing the layer registration of a sample 5-mask layered TFT structure.

With reference next to FIG. 2, there is shown therein the layer registration of a sample 5-mask layer TFT pattern. The structure illustrated in FIG. 2 consists of a 5 mil PEN flexible substrate over which a 600 nm SiO$_2$/Si$_3$N$_4$ buffer layer has been formed. After annealing at 180° C. for 30 minutes, the device layers were deposited and pattered consistent with the process outlined above. Four device arrays 12, 14, 16, and 18 are shown in FIG. 2. Each array itself consists of four thin-film transistor (TFT) and contact structures, for example 12a, 12b, 12c, and 12d. Each TFT and contact structure itself includes a drain pad 20, a gate busline 22, and a TFT 24. The layers forming the TFTs extend into the page and are well known in the art.

While tantalum (Ta) has been used as the gate metal in the device illustrated in FIG. 1, according to other embodiments, other materials may serve that function. For example, we have also used a bilayer structure comprised of chromium atop aluminum (Al/Cr). For such a bilayer, with chromium at ~300 Å thick and aluminum at ~700 Å thick, the film stress was measured at approximately −55 megapascals (MPa), compressive. Other material systems for this and other layers of the thin-film transistor may readily be employed, as will be apparent to those skilled in the art.

It can be seen from FIG. 2 that the layers are appropriately registered to one another, and indeed, measurements of this structure show the registration to be within the common design rule of 15 microns (μm). The buffer layer allows the design rule to be maintained over a 6-inch×6-inch array using 5 mil thick PEN. The same process has also been demonstrated on thin films with high built-in stress, such as Ta and Ta$_2$O$_5$.

Figure 3:
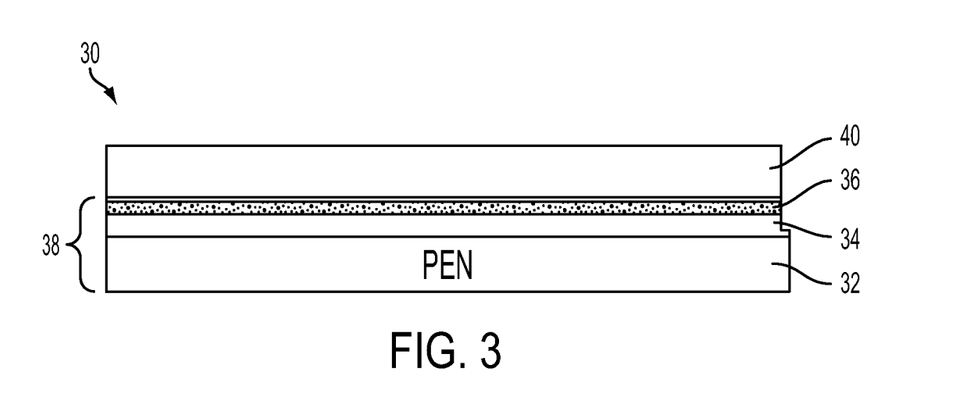
FIG. 3 is a cross section view of an illustrative embodiment of an annealed-buffer heterostructure.

With reference next to FIG. 3, there is shown therein a cross section of an illustrative embodiment of an annealed-buffer heterostructure 30. As described above, heterostructure 30 comprises a flexible substrate 32, such as PEN. Formed over substrate 32 is buffer layer 34, and over that top metal layer 36. Substrate 32 and layers 34 and 36 together form stack 38. Typical thin-film transistor deposition and patterning steps may then result in the formation of a TFT 40 over stack 38. In place of TFT 40, other device fabrication techniques may be employed to produce microelectronic, electrooptical, electromechanical or other similar devices over stack 38. For illustration purposes only, the focus of the description herein is on thin-film transistors, but this description should in no way be read to limit the application of the annealed buffer layer process exclusively thereto.

Thermo-Mechanical Analysis

When barrier layer 34 is deposited at an elevated temperature and then cooled down, both substrate 32 and barrier layer 34 develop stresses. At room temperature they have the same strain but different (opposite) stresses (per force balance). The strains are developed due to thermal mismatch between the material forming substrate 32 and the material forming barrier layer 34. Once TFT 40 is formed thereover, the stack is completely free at the edges, enabling the structure to relieve stress through bending and stretching. The incremental strain in each layer is a function of the neutral plane position, elastic properties, and thicknesses of each layer. In order for the film stack to be free at the edges (thereby, inducing the overall curvature), the following force balance has to hold:

$$\Sigma \sigma_i t_i = 0$$

where $\sigma_i$ is the stress in each layer.

If the initial strain in each layer is $\in_{misfit}$ (which results from heating/cooling and built-in stress), then the increment in strain in each layer is:

$$\Delta \in = \Delta \in_{misfit} + \Delta \in_{bending} + \Delta \in_{elastic}$$

The bending strain is given by:

$$\Delta \varepsilon_{bending} = -\kappa \times (y - s)$$

and $$\Delta \varepsilon_{elastic} = \frac{\sum B_i \varepsilon_i^{misfit} t_i}{\sum B_i t_i}$$

where $B_i$ is the biaxial modulus of each layer and $t_i$ is each layer's thickness. Here, s is the position of the neutral plane, which is:

$$s = \frac{1}{2} \frac{\sum B_i (y_{i+1}^2 + y_i^2)}{\sum B_i (y_{i-1} - y_i)}$$

The overall curvature can be calculated as follows:

$$\kappa = -\frac{\sum B_i (y_{i+1}^2 - y_i^2)}{\sum B_i (y_{i+1} - y_i)}$$

Figure 4:
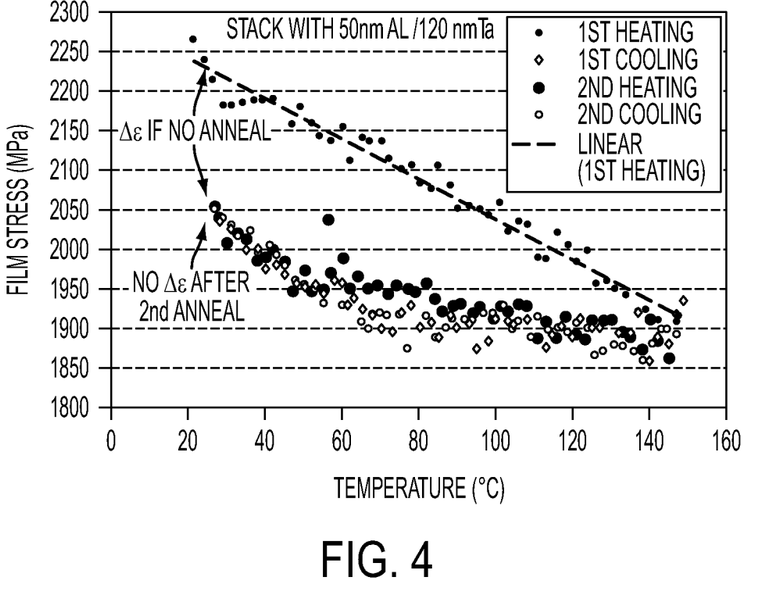
FIG. 4 is a graph illustrating the stress in a tantalum layer plotted against temperature (or strain) corresponding to a number of heating and cooling cycles.

We measured wafer curvature to investigate the stress development in a film on a substrate due to thermal mismatch. The barrier was deposited conventionally onto a silicon (Si) substrate and cooled down to room temperature. A tantalum (Ta) layer was sputter-deposited at room temperature. Two heating/cooling cycles were then performed to replicate processing conditions. FIG. 4 is a graph illustrating the Ta stress vs. temperature (or strain) corresponding to these cycles. There are a number of distinct, identifiable stages present in the heating/cooling cycles which may be seen in the graph of FIG. 4. These stages are:

I. Initial Heating: the initial stress is tensile, at −2.25 gigapascals (GPa) (due to the intrinsic stress within the as-deposited Ta) relaxing to 1.9 GPa when heated to 150° C.

II. Initial Cooling: the final stress state of −2.05 megapascals (MPa) is significantly different from the initial state. This difference in stress would have to be accommodated elastically in the substrate/film stack. This difference in the stress is accountable for the $\Delta \in_{ifnoanneal}$, shown by the arrow.

III. Second Heating: the curve essentially repeats the cooling curve, showing mainly elastic deformation and tendency towards relaxation at higher temperatures.

IV. Second Cooling: the final stress state after the second cooling is very similar to the stress prior to the second cycle. This means that during the 2nd (and subsequent) heating/cooling cycles, very minimal additional elastic strains would have to be accommodated by the substrate if the temperature remains below the anneal temperature.

Figure 5:
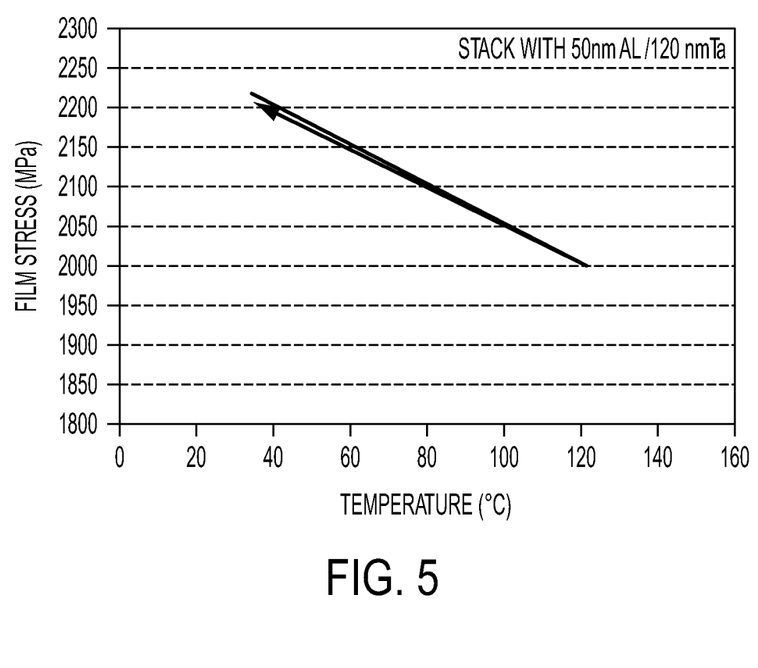
FIGS. 5, 6, and 7 are fiducial reference measurement made prior to and during the heating and cooling cycle for a layer structure heated below the plastic deformation temperature, above the plastic deformation temperature, and first above then below the plastic deformation temperature, respectively.
Figure 6:
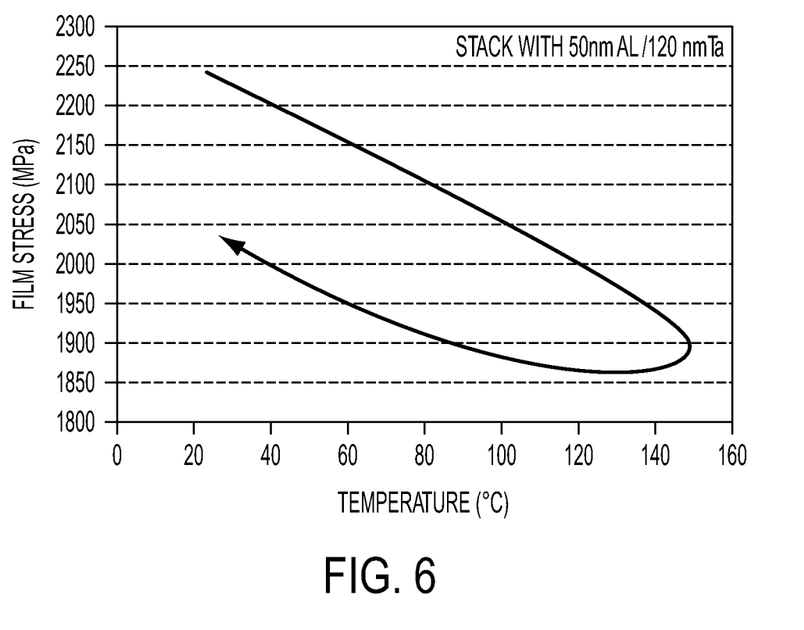
Figure 7:
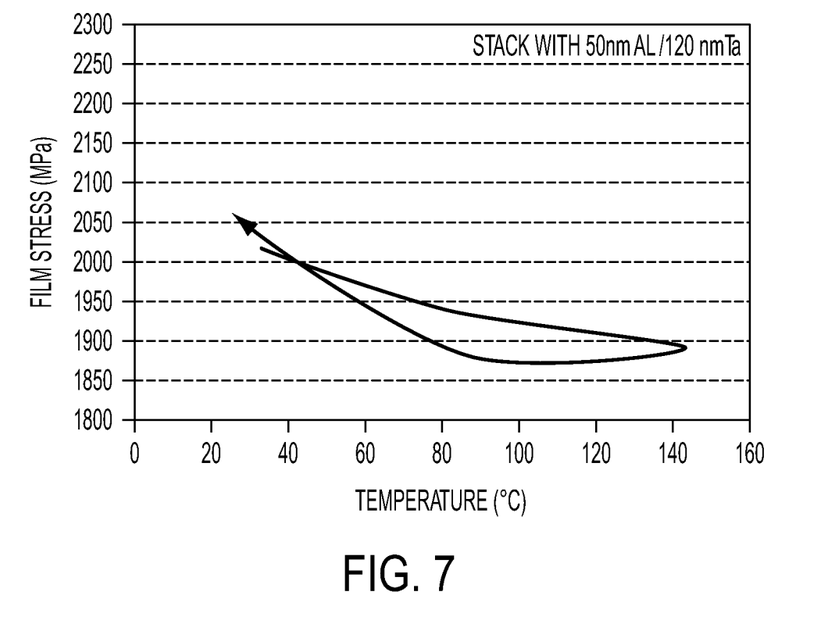

These cycles are illustrated by the curves of FIGS. 5-7. With reference first to FIG. 5, a fiducial reference measurement was made prior to and during the heating and cooling cycle. As the stack is heated, the stress decreases (relaxes). The stack is heated from room temperature to a temperature of approximately 125° C., then cooled back to room temperature. The stress of this cycle returns roughly to its intrinsic, as-deposited level at room temperature. This cycle indicates that the thermally-induced deformation was elastic, and the stack was not annealed. If the anneal process were to take place on this stack at a temperature at or below this temperature, the final, cooled structure would be dimensionally approximately equal to its initial dimensions. Some curvature may be observed in such a stack, but only to a minimal degree. The problem, however, is typical for forming a TFT on a stack at this point in the range of ~150° C.-170° C.

With reference next to FIG. 6, a fiducial reference measurement was again made prior to and during the heating and cooling cycle. As the stack is heated, the stress again decreases (relaxes). In the embodiment shown in FIG. 6, the stack is heated from room temperature to a temperature of approximately 150° C., then cooled back to room temperature. Upon cooling, the stress of this cycle returns to a level lower than its intrinsic, as-deposited level at room temperature, in this example a difference of approximately 200 MPa. This indicates that the thermally-induced deformation was plastic, and the stack was annealed. If processing were to take place on this stack at this temperature, without annealing, the final, cooled structure would be deformed as compared to its initial state to a greater degree than the previously described thermal cycle. This deformation results from heating the substrate above the plastic deformation limit.

If the first registration measurement is done after Ta deposition at room temperature, the non-annealed reference strain corresponds to the residual strain in the substrate/buffer layer at the beginning of the first heating cycle. When this non-annealed structure is subjected to further processing, a significant elastic strain due to the difference between initial and final stress states develops, which results in the "run-out" overlay error or mis-registration. Upon subsequent annealing the structure will become mechanically stable, but the lateral dimensions will have changed compared with the initial reference strain.

With reference to FIG. 7, a fiducial reference measurement was once again made prior to and during the heating and cooling cycle. In this case, the stack has been annealed, meaning that it was heated above the plastic deformation limit, in this case at or above around 150° C., then cooled. That is, the heating cooling cycle took place after the cycle illustrated in FIG. 6. As the stack is heated, the stress again decreases (relaxes). In the embodiment shown in FIG. 7, the stack is heated from room temperature to a temperature just below 150° C., then cooled back to room temperature. Upon cooling, the stress of this cycle returns to a level very close to its annealed stress level. This indicates that the thermally-induced deformation was again elastic. If processing were to take place on this stack at or below around 150° C., the difference in thermally induced stress relaxation during processing is relatively smaller than the previous case, and the final, cooled structure would show much less deformation as compared to its initial state than the previously described thermal cycle. This reduced in-process stress differential, and reduced difference between initial and final stress present a much more stable platform on which subsequent layers/structures may be formed.

The lateral dimensions between specific fiducial features are determined by the residual strain in the film/substrate structure. This is the annealed reference strain for the subsequent fabrication process. When the entire stack and TFT structure is subjected to subsequent thermal cycling, it is now mechanically stable up to the first annealing temperature. Thus, provided that the TFT process subsequent to the annealing is performed below the anneal temperature, and such that no further plastic deformation of the substrate and buffer layer take place, layer alignment may be maintained in the final TFT (or similar structure) formed over the substrate/buffer layer stack.

The physics of modern electrical devices and the methods of their production are not absolutes, but rather statistical efforts to produce a desired device and/or result. Even with the utmost of attention being paid to repeatability of processes, the cleanliness of manufacturing facilities, the purity of starting and processing materials, and so forth, variations and imperfections result. Accordingly, no limitation in the description of the present invention or its claims can or should be read as absolute. The limitations of the claims are intended to define the boundaries of the present invention, up to and including those limitations. To further highlight this, the term "substantially" may occasionally be used herein in association with a claim limitation (although consideration for variations and imperfections is not restricted to only those limitations used with that term). Similarly, the term "approximately" or other similar terms may be used herein. While as difficult to precisely define as the limitations of the present invention themselves, we intend that these terms be interpreted as "to a large extent", "as nearly as practicable", "within technical limitations", and the like.

Furthermore, while a plurality of preferred exemplary embodiments have been presented in the foregoing detailed description, it should be understood that a vast number of variations exist, and these preferred exemplary embodiments are merely representative examples, and are not intended to limit the scope, applicability or configuration of the invention in any way. Rather, the foregoing detailed description provides those of ordinary skill in the art with a convenient guide for implementation of the invention, and contemplates that various changes in the functions and arrangements of the described embodiments may be made without departing from the spirit and scope of the invention defined by the claims thereto.

What is claimed is:

1. A method of manufacturing a layered electronic device over a flexible plastic substrate, comprising:
   depositing a buffer layer over said flexible plastic substrate;
   forming a metal layer over and in physical contact with said buffer layer to thereby form a layer structure, such that said layer structure has a first lateral dimension and an induced first strain in said buffer layer;
   heating said layer structure to an anneal temperature which is greater than the temperature at which the plastic substrate, the buffer layer, and the metal layer plastically deform such that said layer structure is deformed to have a second lateral dimension greater than said first lateral dimension and inducing a second strain in said buffer layer greater than said first strain;

cooling the layer structure such that said layer structure remains substantially at said second lateral dimension, and substantially with at least said second strain in said buffer layer;

following said cooling, forming over said metal layer a layered electronic device such that:

said metal layer forms a first metal layer of said electronic device;

said forming includes patterning of said metal layer;

said layered electronic device deposited at a temperature that does not exceed said anneal temperature such that upon cooling said flexible plastic substrate, said buffer layer, and said layered electronic device formed thereover substantially return to said second lateral dimension; and said layered electronic device is formed so as to be free at lateral edges thereof such that stress therein may be relieved through bending and stretching of the device with the substrate.

2. The method of claim 1, wherein said buffer layer comprises:

a stacked structure of silicon dioxide and silicon nitride.

3. The method of claim 2, wherein said buffer layer is formed to be silicon dioxide layer in the range of 200-400 nanometers thick formed over a silicon nitride layer in the range of 200-400 nanometers thick.

4. The method of claim 3, wherein each of said silicon dioxide and said silicon nitride layers are approximately of the same thickness.

5. The method of claim 4, wherein each of said silicon dioxide and said silicon nitride layers are each approximately 300 nanometers thick.

6. The method of claim 1, wherein said flexible plastic substrate is polyethylene naphthalate.

7. The method of claim 1, further comprising:

depositing said buffer layer over said flexible plastic substrate under vacuum pressure within a vacuum chamber; and wherein said step of heating is performed for approximately 30 minutes while maintaining the flexible plastic substrate and buffer layer under said vacuum pressure within said vacuum chamber, and further wherein the temperature within said vacuum chamber during said step of heating is approximately 180° C.

8. The method of claim 1, wherein said metal layer is formed of tantalum, and is formed to be in the range of approximately 100-150 nanometers thick.

9. The method of claim 8, wherein said metal layer is formed to be approximately 120 nanometers thick.

10. The method of claim 1, further comprising:

depositing said buffer layer over said flexible plastic substrate and said metal layer over said buffer layer under vacuum pressure within a vacuum chamber; and wherein said step of heating is performed for approximately 30 minutes while maintaining the layer structure under said vacuum pressure within said vacuum chamber, and further wherein the temperature within said vacuum chamber during said step of heating is approximately 180° C.

* * * * *